(12) United States Patent
Song (10) Patent No.: US 6,300,584 B1
(45) Date of Patent: Oct. 9, 2001

(54) LOADING/UNLOADING CONTROL APPARATUS OF SEMICONDUCTOR DEVICE AND CONTROL METHOD THEREOF

(75) Inventor: Jae Myung Song, Kyungki-do (KR)

(73) Assignee: Mirae Corporation, Chunan-shi (KR)

( * ) Notice: Subject to any disclaimer, the term of this patent is extended or adjusted under 35 U.S.C. 154(b) by 0 days.

(21) Appl. No.: 09/469,518

(22) Filed: Dec. 22, 1999

(30) Foreign Application Priority Data

Dec. 23, 1998 (KR) .................................................. 98-57702
Dec. 23, 1998 (KR) .................................................. 98-57703
Dec. 23, 1998 (KR) .................................................. 98-57704

(51) Int. Cl.⁷ .................................................. B07C 5/344
(52) U.S. Cl. .......................... 209/573; 209/509; 209/552; 209/600
(58) Field of Search ................................. 209/509, 552, 209/600, 573

(56) References Cited

U.S. PATENT DOCUMENTS 5,865,319 * 2/1999 Okuda et al. .................. 209/574

* cited by examiner

Primary Examiner—Donald P. Walsh
Assistant Examiner—Mark J. Beauchaine
(74) Attorney, Agent, or Firm—Fleshner & Kim, LLP (57) ABSTRACT

The present invention relates to a loading/unloading control apparatus of a semiconductor device and a control method thereof in which a time for loading/unloading a semiconductor device can be saved when a produced semiconductor device is loaded and unloaded to be tested. The present invention provides a loading/unloading control method of a semiconductor device including the steps of: determining whether a semiconductor device for being sorted to an unloading buffer exists by a microprocessor; determining whether a sorting tray has been prepared when the semiconductor device exists to be sorted to the unloading buffer; requiring the sorting tray to be replaced by the microprocessor when the sorting tray has not been prepared; and feeding the semiconductor device served at the unloading buffer to the sorting buffer by a X-Y axis picker during the replacing of sorting tray.

21 Claims, 11 Drawing Sheets

LOADING/UNLOADING CONTROL APPARATUS OF SEMICONDUCTOR DEVICE AND CONTROL METHOD THEREOF

BACKGROUND OF THE INVENTION

1. Field of the Invention

This invention relates to a loading/unloading control apparatus of a semiconductor device and a control method thereof in which the time for loading/unloading a semiconductor device for testing can be reduced.

2. Description of the Prior Art

In general, some properties, such as an electric property, of a produced semiconductor device is tested by using a test device. At this time, a handler is used for transferring a semiconductor device to a test device. After the test is completed, the semiconductor device is classified according to capacity level.

Figure 1:
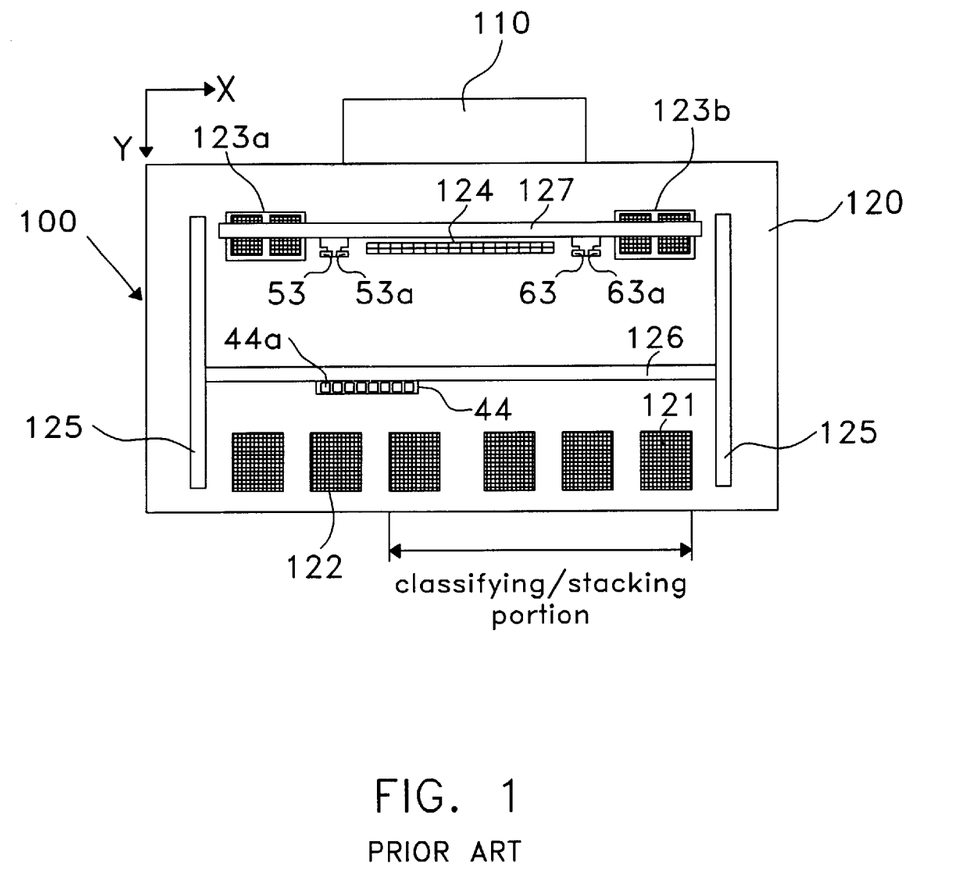
FIG. 1 is a plan view of a conventional handler.

FIG. 1 is a plan view of a conventional handler. As shown in FIG. 1, a conventional handler 100 comprises a chamber 110, and a working table 120 having an apparatus for loading or unloading the device to a chamber 110 and for classifying and stacking the semiconductor device.

The chamber 110 includes a heating chamber for heating a fed semiconductor device, a test site mounted with a test device for testing a heated semiconductor device, and a cooling chamber for cooling the semiconductor device received from the test site.

Therefore, the semiconductor device is transferred to the heating chamber thereby to be heated at a test temperature, the heated semiconductor device is then tested by the test device provided at the test site. Next, the tested device is transferred to the cooling chamber to be cooled by a constant temperature so that the semiconductor device is classified and stacked by a picker according to the result of test.

On the working table 120 a supply tray 122 is placed for stacking the semiconductor device to be tested. A classifying and stacking portion where a plurality of sorting trays 121 are positioned is formed on one side of the supply tray 122 so as to classify and stack the tested semiconductor device.

The semiconductor device received at the supply tray 122 is sucked by a X-Y axis picker 44 provided with a suction nozzle 44a so that the semiconductor device is moved in X-axis and Y-axis direction along guide axis 125 and 126 thereby to be transferred to a loading buffer 123a. Next, the semiconductor device sucked by the suction nozzle 53a is transferred to an aligner 124 by a loading picker 53 moving in X-axis direction along the guide axis 127 thereby to be loaded to the test tray not shown. The test tray serves to connect the semiconductor device to the test device through the chamber 110.

The tested device is unloaded to the aligner 124 thereby to be transferred to an unloading buffer 123b at the state of being sucked by the suction nozzle 63a of an unloading picker 63 moving in X-axis direction along the guide axis 127.

Accordingly, the semiconductor device is classified and stacked at the sorting tray 121 based on the test characteristics by the X-Y axis picker 44 thereby to completing the loading/unloading.

However, the conventional handler 100 having the above constructions has problems. The sorting tray 121 is required to be replaced in order for the tested semiconductor device to be classified and stacked to the sorting tray 121, the X-Y axis-picker 44 should wait until the sorting tray 121 is completely replaced. Therefore, the unloading work is delayed thereby causing an increase in time for classifying the semiconductor device.

Furthermore, in the case when the X-Y axis picker 44 is selectively used for loading/unloading the semiconductor device, the unloading picker is under non-working state when the semiconductor device is first loaded to the test site. The picker for loading the semiconductor device becomes stopped at its working state when the semiconductor device is unloaded.

Furthermore, the X-Y axis picker 44 repeatedly supplies a semiconductor device served at the supply tray 122 to the loading buffer 123a so that the test device loads the semiconductor device to be tested. After all the semiconductor devices are served at the tray 122, they are then transferred to the loading buffer 123a, the supply tray 122 is replaced with a new one.

However, the X-Y axis picker 44 is under a standby state during the time the tray 122 is replaced. Accordingly, the semiconductor device can not be supplied during the replacing of supply tray 122 thereby causing the loading function not to be performed smoothly.

SUMMARY OF THE INVENTION

Accordingly, it is an object of the present invention to provide a loading/unloading control apparatus of a semiconductor device and a control method thereof in which a semiconductor device served at an unloading buffer is transferred to a sorting buffer during a time of replacing a sorting tray thereby to smoothly perform an unloading working of the semiconductor device.

It is another object of the present invention is to provide a loading/unloading control apparatus of a semiconductor device and a control method thereof in which each picker can simultaneously perform a loading/unloading working.

It is another object of the present invention is to provide a loading/unloading control apparatus of a semiconductor device and a control method thereof in which each picker can individually perform a loading/unloading working so that the time for loading/unloading can be saved. Furthermore, the picker's feeding distance and standby time is shortened preventing a collision during the feeding of the picker so that the productivity of the semiconductor device can be increased.

Still another object of the present invention is to provide a loading/unloading control apparatus of a semiconductor device and a control method thereof in which a semiconductor device served at a supply tray is transferred to a temporary buffer during a time of replacing the supply tray and to a loading buffer thereby to smoothly perform a loading working of the semiconductor device.

To achieve the above objects, there is provided a loading/unloading control method of a semiconductor device which includes the steps of identifying whether a semiconductor device to be sorted to an unloading buffer exists by using a microprocessor; identifying whether a sorting tray is prepared when the semiconductor device exists to be sorted to the unloading buffer; requiring the sorting tray to be replaced by the microprocessor when the sorting tray is not prepared; and transferring the semiconductor device on the unloading buffer to the sorting buffer with a X-Y axis picker while the replacing of sorting tray takes place.

The present invention provides a loading/unloading control method of a semiconductor device which includes the steps of identifying whether a semiconductor device to be tested exists at a supply tray; transferring the semiconductor device from the supply tray to a first and second picker with a X-Y axis picker when the semiconductor device exists and stacking the semiconductor device stacked at the first and second buffer to an aligner with the first and second picker; determining whether a tested semiconductor device exists; and transferring the tested semiconductor device to the first and second buffer from the aligner by the first and second picker when the tested semiconductor device exists and classifying and stacking the served semiconductor device at the first and second buffer to the sorting tray by the X-Y axis picker.

The present invention provides a loading/unloading control method of a semiconductor device which includes the steps of determining whether a temporary buffer is empty in a microprocessor when the semiconductor device is not required to be supplied; transferring the semiconductor device served at a supply tray to the temporary buffer by the X-Y axis picker when the temporary buffer is empty; identifying whether the semiconductor device exists at the supply tray by the microprocessor when the semiconductor device is required to be supplied to the loading buffer; requiring the replacing of the supply tray by the microprocessor when the supply tray is not served with the semiconductor device; identifying whether the replaced supply tray is n−1 when the supply tray has been replaced; and transferring the semiconductor device served at the temporary buffer to the loading buffer by the X-Y axis picker when the replaced supply tray is not n−1.

BRIEF DESCRIPTION OF THE DRAWINGS

The present invention will become more fully understood from the following description of embodiments with reference to the accompanying drawings in which.

DETAILED DESCRIPTION OF THE PREFERRED EMBODIMENTS

Now, embodiments according to the present invention will be in detail described with reference to drawings.

Figure 3:
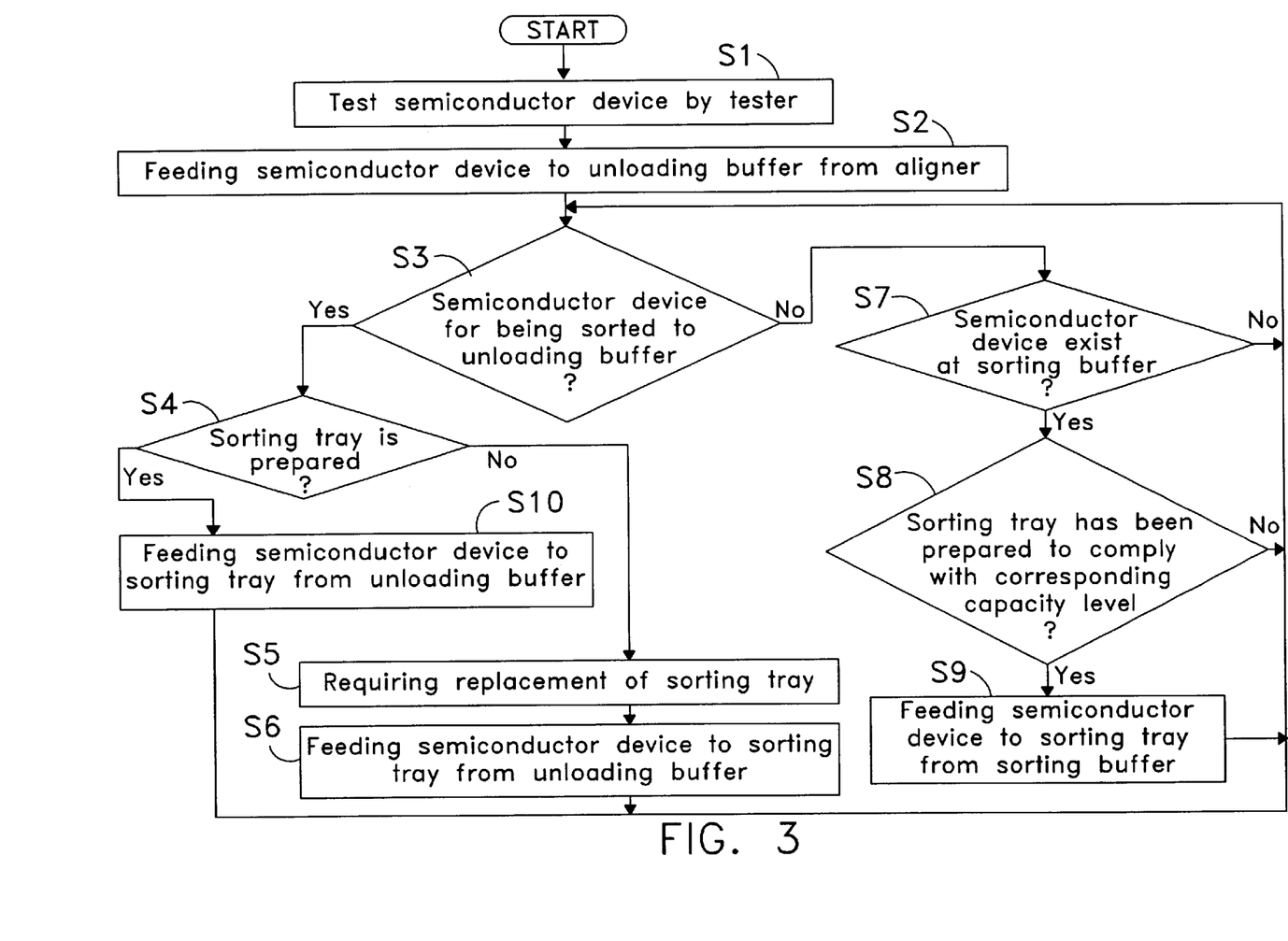
FIG. 3 is a flow chart showing an unloading method of a semiconductor device using a sorting buffer in a handler according to the present invention.
Figure 4:
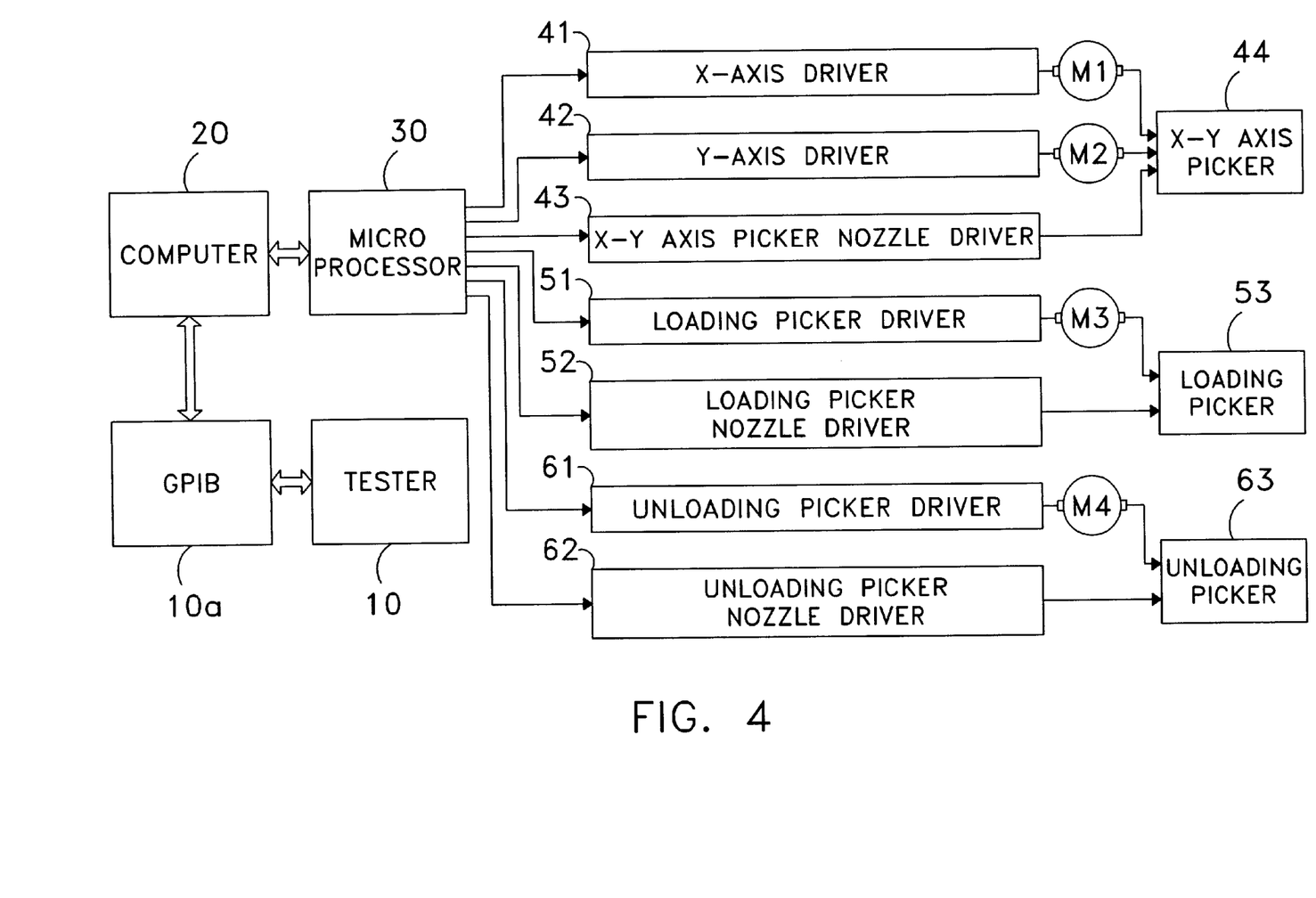
FIG. 4 is a block diagram of a loading apparatus of a semiconductor device according to the present invention.

FIG. 3 is a flow chart showing an unloading method of a semiconductor device using a sorting buffer in a handler according to the present invention. FIG. 4 is a block diagram of a loading device of a semiconductor device according to the present invention; and FIG. 5 is a plan view of a handler according to the present invention.

Figure 5:
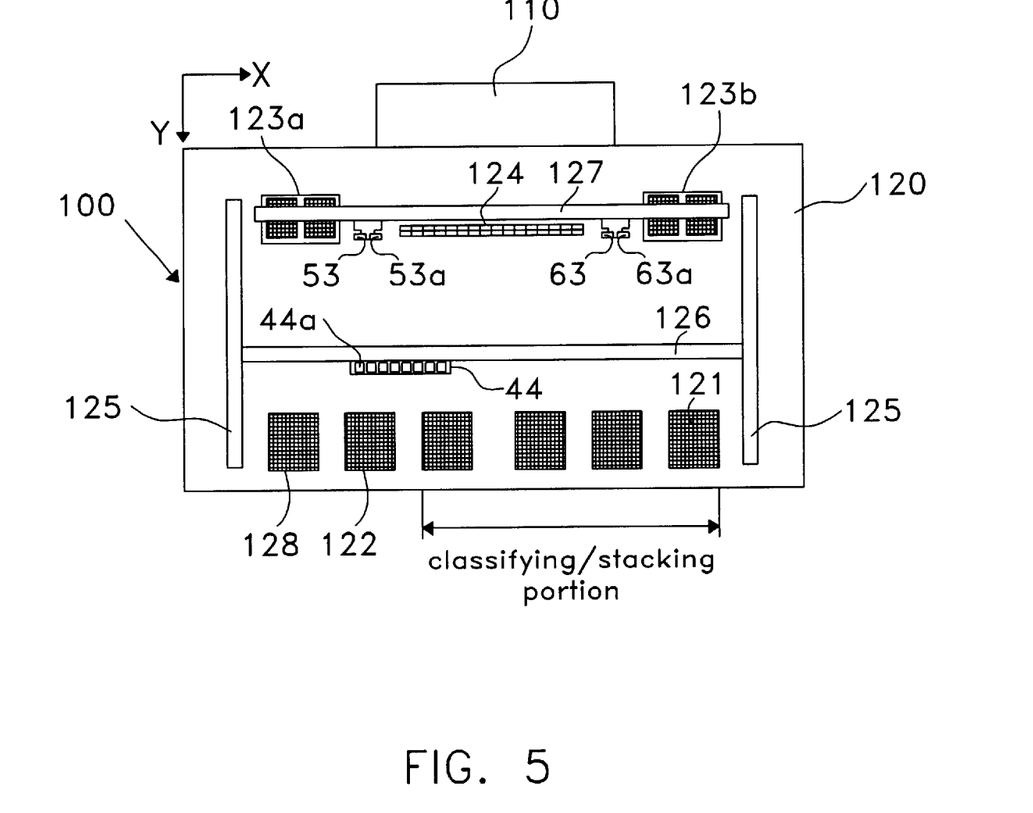
FIG. 5 is a plan view of a handler according to the present invention.

As shown in FIGS. 3 to 5, a loading/unloading method of a semiconductor device according to the present invention comprises: step S1 of testing a semiconductor device loaded at a test device of a chamber 110; step S2 of transferring a tested semiconductor device from an aligner 124 to an unloading buffer 123b by an unloading picker 63 after a tested semiconductor device is mounted at the aligner 124; step S3 of determining whether a semiconductor device for being sorted exits in the unloading buffer 123b; step S4 of determining whether a sorting tray 121 has been prepared when a semiconductor device exists in the unloading buffer 123b; step S5 of requiring the sorting tray 121 to be replaced by the microprocessor 30 when the sorting tray 121 has not been prepared; and step S6 of feeding the semiconductor device at the unloading buffer 123b to the sorting buffer 128 by a X-Y axis picker 44 during the replacing of the sorting tray 121.

The handler 100 of the present invention has the same construction as the conventional handler in FIG. 1 except that the semiconductor device is temporarily unloaded by using the sorting buffer 128 in FIG. 5.

A process for loading the semiconductor device to the test device 10 provided at the chamber 110 will now be briefly described.

First, a computer receives a test result for the unloading semiconductor device through a general purpose interface bus (GPIB) 10a.

Accordingly, the computer transmits the data it received to a microprocessor 30 so that the microprocessor 30 executes a control program of a handler 100 thereby to classify and stack the tested semiconductor device according to the capacity level to the sorting tray.

The microprocessor 30 transfers the semiconductor device on the supply tray 122 to the loading buffer 123a, which then transfers the semiconductor device to the test device 10 so that the classified semiconductor device can be again classified and stacked.

The semiconductor device is transferred by the X-Y axis picker 44, which is controlled by the first and second motors M1 and M2. The first and second motors M1 and M2 are controlled by the X, Y picker drivers 41 and 42. At this time, the semiconductor device is sucked by the nozzle 44a which is controlled by the X-Y axis picker nozzle driver 43.

The semiconductor device is then transferred to the loading buffer 123a and is further transferred by a third motor M3 which is controlled by the loading picker driver 51 and is still further transferred to the aligner 124 by the loading picker 53 for sucking with the semiconductor device by the nozzle 53a. At this time, the nozzle 53a is controlled by the loading picker nozzle driver 52. The semiconductor device is transferred to the aligner 124 and then loaded to the chamber 110, where it is heated at the test temperature. Finally, the semiconductor device is transferred to the test device 10 to be tested.

The tested semiconductor device is cooled at the cooling chamber (not shown) by the constant temperature thereafter to be unloaded from the chamber 110. The semiconductor device being unloaded from the chamber 110 is classified and stacked in the sorting tray 121 according to the capacity level. In order to classify and stack the semiconductor device, it is unloaded from the chamber 110 and mounted to the aligner 124 thereby to be transferred to the unloading buffer by using the unloading picker 63.

The unloading picker 63 is controlled by the fourth motor M4 which is controlled by the unloading picker driver 61. The semiconductor device is sucked by the suction nozzle 63a to be transferred. Next, the microprocessor determines whether a semiconductor device for being sorted to the unloading buffer 123b exists. If a semiconductor device for being sorted to the unloading buffer 123b does not exist, the microprocessor 30 determines whether a semiconductor device for being sorted to the sorting buffer 128 exists.

As a result of determination, when a semiconductor device for being sorted to the sorting buffer 128 does not exist, the microprocessor 30 determines whether a semiconductor device to be transferred from the aligner 124 to the unloading buffer 123b exists. If the semiconductor device exists at the sorting buffer 128, the microprocessor 30 determines whether the sorting tray 121 corresponding to the capacity level of the semiconductor device served at the sorting buffer 128 has been prepared.

When the sorting tray 121 has not been prepared, the microprocessor 30 determines whether the semiconductor device for being sorted to the unloading buffer 123b has been transferred. If the sorting tray 121 has been prepared, the semiconductor device served at the sorting buffer 128 is transferred to the sorting tray 121 by the X-Y axis picker 44. After that, it is determined whether the unloading buffer 123b has any tested semiconductor devices that need to be sorted to the sorting trays 121. When the semiconductor device has been completely transferred, the microprocessor 30 determines whether the tested semiconductor device exists at the unloading buffer.

When the microprocessor 30 determines that a semiconductor device for being sorted to the unloading buffer 123b exists, the microprocessor 30 determines whether the sorting tray 121 has been prepared (S4). As a result of determination, when the sorting tray 121 has been prepared, the semiconductor device served at the unloading buffer 123b is transferred to the sorting tray 121 by the X-Y axis picker 44 (S 10). After being transferred, it is determined whether the tested semiconductor device exists at the unloading buffer 123b.

As a result of determination at step S4, when the sorting tray 121 does not exist, the microprocessor 30 transfers the semiconductor device served at the unloading buffer 123b to the sorting buffer 128 while the sorting tray 121 is replaced. For this operation, the microprocessor 30 requires the sorting tray 121 to be replaced for being sorted the semiconductor device (S5), and feeds the semiconductor device served at the unloading buffer 123b to the sorting buffer 128 by the X-Y axis picker after the sorting tray 121 is replaced (S6).

Meanwhile, the microprocessor 30 determines, whether the semiconductor device exists at the aligner 124, the unloading buffer 123b and the sorting buffer 128, respectively, by the control program for the handler 100. The control program for the handler 100 is previously stored in the microprocessor 30 or is provided at the outside of the ROM. When the semiconductor device is determined to exist by the microprocessor 30, the semiconductor device is unloaded without stopping while the sorting tray 121 is replaced by using the sorting buffer 128.

Figure 6:
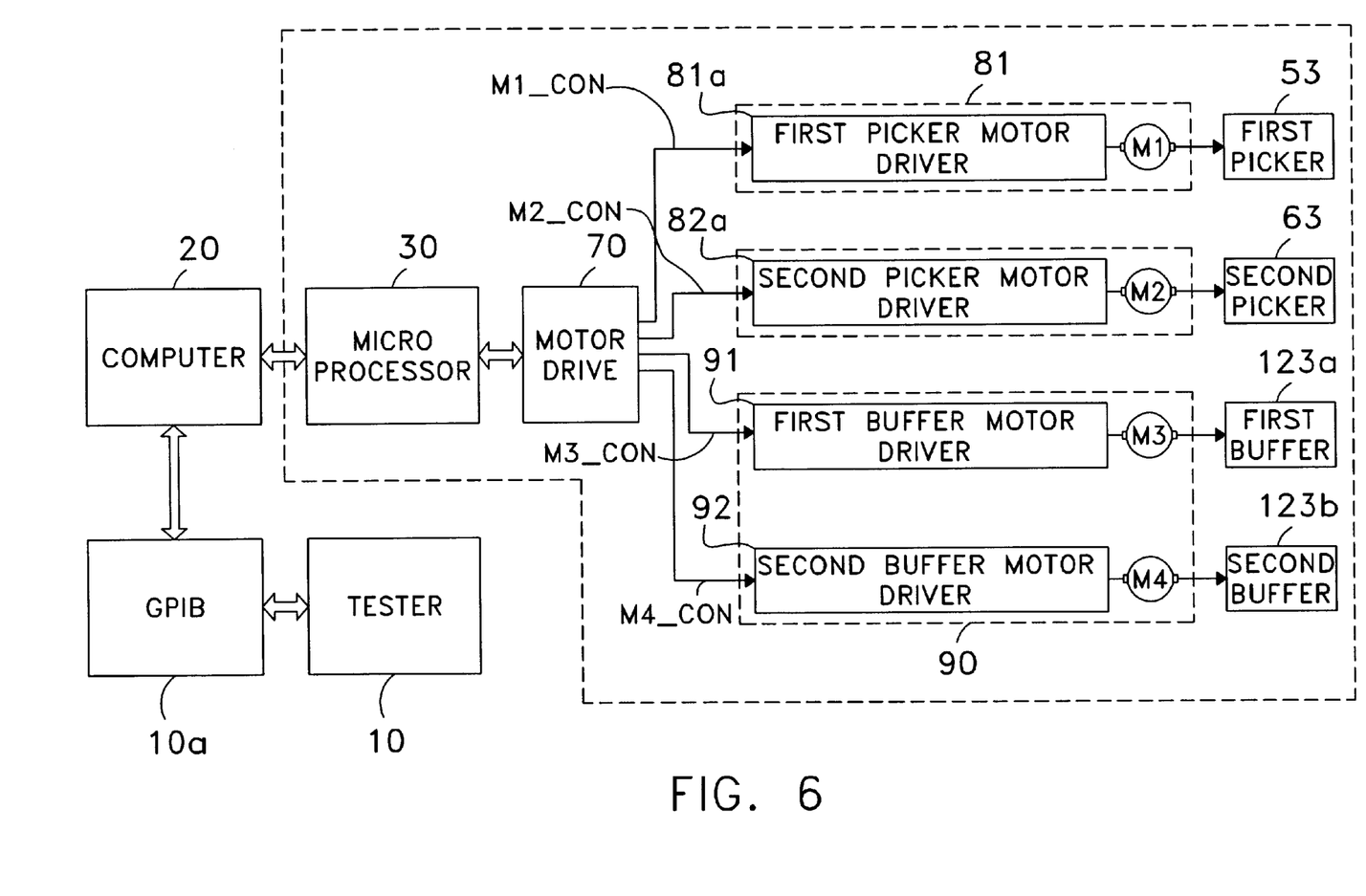
FIG. 6 is a lock diagram of a loading/unloading control apparatus according to another embodiment of the present invention.
Figure 7:
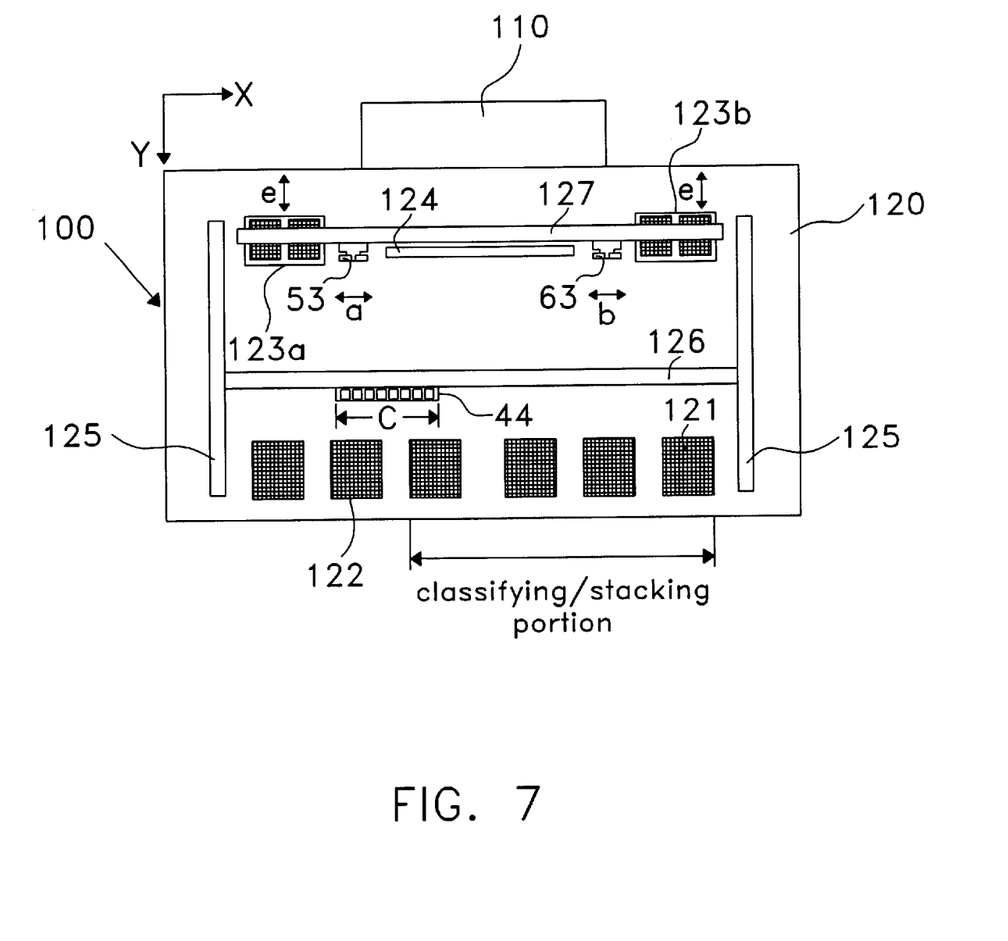
FIG. 7 is a plan view of a handler in FIG. 6.

FIG. 6 is a block diagram of a loading/unloading control apparatus according to another embodiment of the present invention; FIG. 7 is a plan view of a handler in FIG. 6; and FIG. 8 is a flow chart showing a loading/unloading method of a semiconductor device applied to the control apparatus in FIG. 6.

Figure 8:
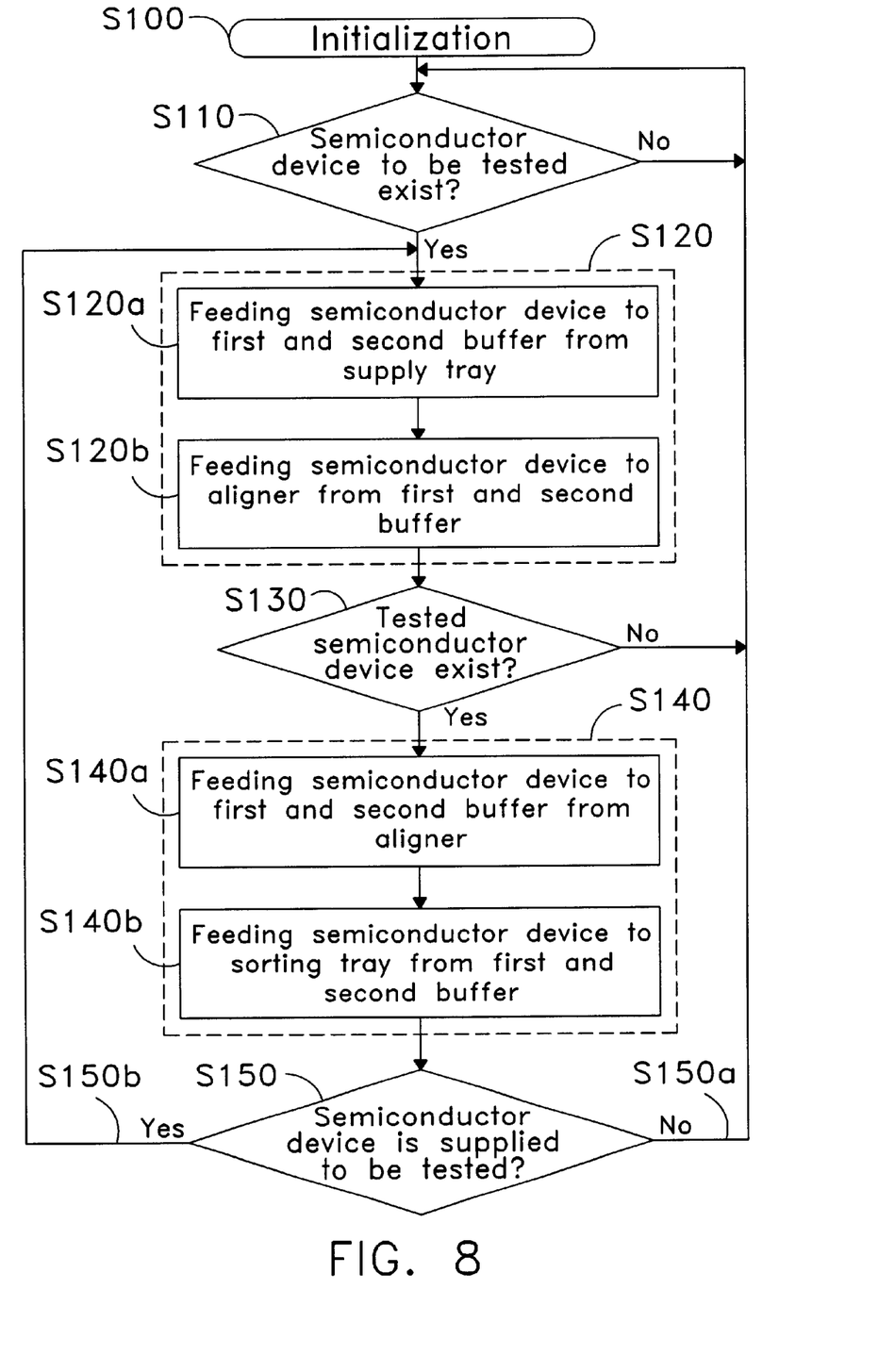
FIG. 8 is a flow chart showing a loading/unloading method of a semiconductor device applied to the control apparatus in FIG. 6.

As shown in FIGS. 6 to 8, a loading/unloading control apparatus according to the present invention comprises: a computer 20 for receiving the result of a test for the semiconductor device from a test device 10 through the GPIB 10a; a microprocessor 30 for controlling and initiating the handler 100, wherein the microprocessor generates and outputs a control signal for transferring the semiconductor device; a motor control unit 70 for receiving the control signal from the microprocessor 30 and for generating first and second motor control signals M1-CON and M2-CON; a first picker driving unit 81 for receiving the first motor control signal M1-CON from the motor control unit 70 thereby to drive the first picker 53' and for loading/unloading the semiconductor device to the first buffer 123a and an aligner 124; a second picker driving unit 82 for receiving the second motor control signal M2-CON from the motor control unit 70 thereby to drive the second picker 63' and for loading/unloading the semiconductor device to the second buffer 123b' and the aligner 124.

The computer 20 is used to establish the condition of a test working. When the computer 20 establishes a test condition, the handler 100 operates under the test condition. The handler 100 is controlled and initialized its operation by the microprocessor 30. After being initialized of the handler 100, the microprocessor 30 feeds the semiconductor device to the chamber 110 to be tested. The semiconductor device for being transferred to the chamber 110 is firstly stacked at the supply tray 122 provided on. the working table 120 of the handler 100.

The semiconductor device stacked at the supply tray 122 is transferred to the first buffer 123a and the second buffer 123b by the X-Y axis picker 44. The X-Y axis picker 44 is mounted to the first guide axis 126 installed at the working table 120. The X-Y axis picker 44 mounted to the first guide axis 126 slides along the first guide axis 126 to be moved in the X-axis direction as shown by the arrow marked "c". The X-Y axis picker 44 moving in the X-axis direction is moved in the Y-axis direction by the first guide 126 being moved as shown in the arrow mark "d".

The first guide 126 is moved in the Y-axis direction along the second guide 125 at the state of being coupled to the second guide 125 thereby to move the X-Y axis picker in the Y-axis direction. The X-Y axis picker 44 moving along the first and second guides 126 and 125 forces the semiconductor device stacked at the supply tray 122 to be moved in the X-Y axis direction and to be transferred to the first buffer 123a and the second buffer 123b. At this time, the X-Y axis picker 44 holds the semiconductor device served at the supply tray 122 thereby to be transferred to the first buffer 123a; and continuously feeds the semiconductor device served at the supply tray 122 to the second buffer 123b.

The semiconductor device transferred to the first buffer 123aand the second buffer 123b is further transferred to the aligner 124 to be loaded to the chamber 110. The semiconductor device served at the first buffer 123aand the second buffer 123b are transferred to the aligner 124 by the first picker 53 and the second picker 63. The first picker 53 and the second picker 63 are combined to the third guide axis 127 to be slide and moved in the arrow mark direction "a and b".

The first picker 53 and the second picker 63 moving along the third guide axis 127 are—controlled by the microprocessor 30 thereby to be moved along the third guide axis 127. When the semiconductor device is mounted at the first buffer 123a and the second buffer 123b to be tested, the microprocessor 30 generates a control signal for driving the first picker 53 and the second picker 63. The control signal generated by the microprocessor 30 is outputted to the motor control unit 70.

Accordingly, The motor control unit 70 generates the first motor control signal M1-CON and the second motor control signal M2-CON for driving the first picker 53 and the second picker 63. The first motor control signal M1-CON generated by the motor control unit 70 is outputted to the first picker driving unit 81 and the second motor control signal M2-CON is outputted to the second picker driving unit 82.

The first picker driving unit 81 receives the first motor control signal M1-CON through the first motor driver 81a thereby to generate the first motor driving signal. The first motor M1 is its rotation controlled by the first motor driving signal. The first motor M1 is connected to the first picker 53 through a timing belt not shown. Accordingly, the rotation of the first motor M1 forces the first picker 53 connected to the timing belt to be moved along the third guide axis 127. The first picker 53 moves in the X-axis direction as shown in the arrow mark "a" thereby to transfer the semiconductor devices served at the first buffer 123a to the aligner 124.

At this time, the first buffer 123a, the first picker 53 and the aligner 124 should be complied with the X-axis direction being moved the first picker 53 for feeding the semiconductor device served at the first buffer to the aligner 124. That is, when the semiconductor device served at the first buffer 123a is not at the holding position, the first buffer 123a moves in the y-axis direction as shown in arrow mark "e" for moving the semiconductor device to the holding position of the first picker 53.

The motor control unit 70 generates a third motor control signal M3-CON for moving the first buffer 123a in the y-axis direction and outputs the control signal M3-CON to the first buffer motor driver 91 of the motor driving unit 90.

Accordingly, the first buffer motor driver 91 rotates the third motor M3 according to the third motor control signal M3-CON thereby to move the first buffer so that the first picker is moved to the position for holding the semiconductor device.

Figure 2A:
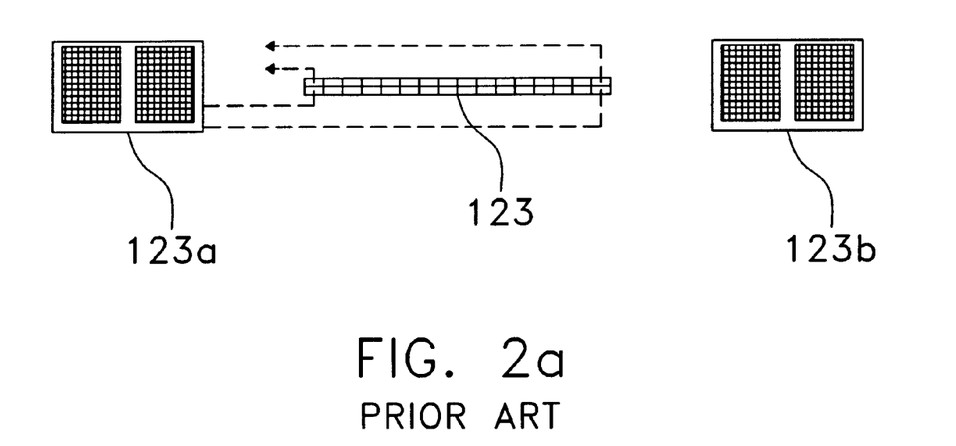
FIGS. 2a and 2b show a state that a semiconductor device is loaded/unloaded by the conventional handler.
Figure 2B:
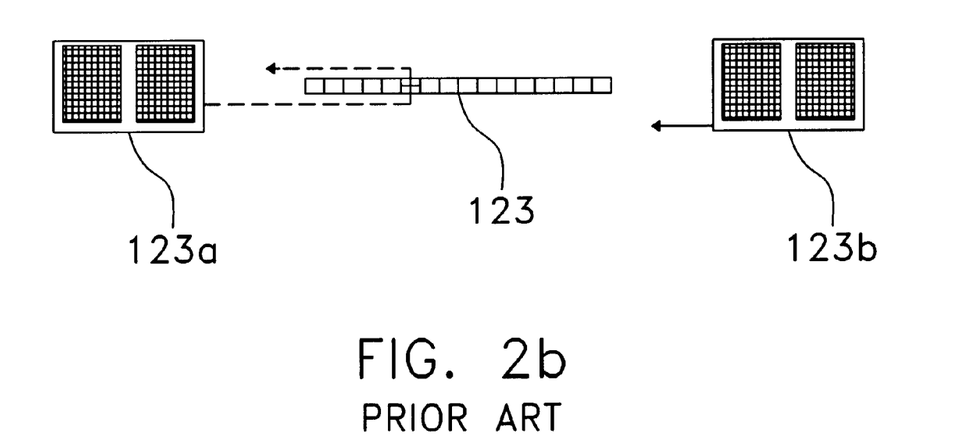

The semiconductor device being transferred to the aligner 124 by the first picker fills up the half of the aligner 124. That is, the aligner 124 is, as shown in FIG. 2, divided by the central line A–B, and accordingly the moving region of the first picker 53 and the second picker 63 is divided according to the central line A–B. The left side of the central line A–B is mounted with the semiconductor device by the first picker 53 and the right side thereof is mounted with other semiconductor device by the second picker 63.

The second picker 63 movement is controlled by the second motor control signal M2-CON from the microprocessor 30. The microprocessor 30 generates the second motor control signal M2-CON to drive the second picker 63 and outputs the control signal M2-CON to the second motor driver 82a of the second picker driving unit 82. Accordingly, the second motor driver 82a generates the second motor driving signal according to the second motor control signal M2-CON thereby to control the second motor M2 and to control the second picker 63. The second motor M2 and the second picker 63 are connected by the timing belt and the second picker 63 moves in the x-axis direction along the third guide axis as shown in the arrow mark "b".

The second picker 63 being moved in the X-axis direction along the third guide axis mounts the semiconductor device served at the second buffer 123b to the aligner 124. The second buffer 123b moves in the Y-axis direction by the second buffer motor driver 92 received with the fourth motor control signal M4-CON from the motor control unit 70 and the fourth motor M4 thereby to hold the semiconductor device by the second picker 63

When the semiconductor device mounted at the second buffer 123b is transferred to the position for being held by the second picker, the semiconductor device is held by the second picker 63 thereby to be transferred to the aligner 124. While the semiconductor device is mounted at the aligner 124 by the first picker 53 and the second picker 63 the first picker 53 is maintained from the second picker 63 by a predetermined distance. That is, when the first picker 53 closes to the central line A–B set at the aligner 124, the second picker 63 is moved to be distanced from the central line A–B so that they do not collide. Furthermore, by moving the first picker 53 and the second picker 63 on the basis of the central line A–B, the first picker 53 and the second picker 63 are do not move from the first buffer 123a or the second buffer 123b to the both ends of the aligner 124 thereby to decreasing the moving distance when the first picker 53 and the second picker 63 are separated for loading operation and unloading operation, respectively.

When the semiconductor device mounted at the aligner 124 is loaded to the chamber 110 to be tested, the tested semiconductor device is unloaded from the chamber 110.

Meanwhile, the process for unloading the semiconductor device from the chamber 110 is performed to be contrary to the process for transferring of the semiconductor device from the first buffer 123a and the second buffer 123b to the aligner 124. That is, the semiconductor device tested at the chamber 110 is mounted at the aligner 124 and is transferred to the first buffer 123a and the second buffer 123b by the first picker 53 and the second picker 63, respectively. The semiconductor device transferred to the first buffer 123a and the second buffer 123b is transferred to the sorting tray 121 located at the position for distributing and stacking by the X-Y axis picker 44. After being completed the loading working of the semiconductor device, the first picker 53 and the second picker 63 simultaneously unloads the semiconductor device thereby to increase efficiency of the picker.

The first picker 53 and the second picker 63 are controlled by the control program previously stored at the ROM of the microprocessor 30.

FIG. 8 is a flow chart showing the loading/unloading control method of the semiconductor device according to the present invention.

Referring to FIG. 8, the loading/unloading control method of the semiconductor devices includes the step S110 of determining whether the semiconductor device to be tested exists at the supply tray 122; the step S120 of transferring the semiconductor devices from the supply tray 122 to the first picker 53 and the second picker 63 by the X-Y axis picker 44 when the semiconductor devices exist at the supply tray 122, and stacking the semiconductor devices stacked at the first buffer 123a and the second buffer 123b to the aligner 124 by the first picker 53 and the second picker 63; the step S130 of determining whether tested semiconductor devices exist while the semiconductor devices are stacked to the aligner 124 by the first picker 53 and the second picker 63; and the step S140 of transferring the tested semiconductor devices from the aligner 124 to the first buffer 123a and the second buffer 123b by the first picker 53 and the second picker 63 when the tested semiconductor devices are determined to exist and classifying and stacking the semiconductor device stacked at the first buffer 123a and the second buffer 123b to the sorting tray 121 by the X-Y axis picker 44.

The microprocessor 30 initializes the handler 100 (S100). After the handler 100 is initialized, the microprocessor 30 determines whether semiconductor devices to be tested exist at the supply tray 122 (S110). When semiconductor devices to be tested exist at the supply tray 122, the semiconductor devices are transferred from the supply tray 122 to the first buffer 123a and the second buffer 123b by the X-Y axis picker, and are stacked to the aligner 124 by the first picker 53 and the second picker 63 (S120).

The semiconductor devices to be tested are in turn transferred from the supply tray 122 to the first buffer 123a and the second buffer 123b (S120a). The semiconductor device is stacked at the aligner 124 by the first picker 53 and the second picker 63 (S120b) and supplied to the test device 10 to be tested. The result of test is transmitted to the computer 20 through the GPIB 10a thereby to be determined the capacity level.

Next, a determination is performed whether tested semiconductor devices exist while the semiconductor device to be tested is stacked at the aligner 124 for classifying according to the capacity level. As a result of determination, when tested semiconductor devices exist, they are classified and stacked at the sorting tray 121 by the X-Y axis picker 44 (S140).

The semiconductor devices stacked at the aligner 124 are transferred from the aligner 124 to the first buffer 123a and the second buffer 123b by the first picker 53 and the second picker 63 (S140a). The tested semiconductor devices are classified and stacked at the sorting tray 121 by the X-Y axis picker 44 (S140b).

A determination is performed whether the semiconductor device to be tested has been supplied or not while the tested semiconductor device is classified and stacked (S150). When semiconductor devices to be tested have been supplied, the semiconductor devices are transferred to the first buffer 123a and the second buffer 123b by the X-Y axis picker 44 and are transferred to the aligner 124 by the first picker 53 and the second picker 63. Meanwhile, when the semiconductor devices to be tested have not been supplied, a determination whether the supply tray 122 has been supplied is performed. As a result of that, when the tray 122 has not been supplied, the semiconductor device is completed its test thereby to be completed a working.

As the foregoing description while the semiconductor device is stacked at the aligner 124, the semiconductor device is simultaneously loaded and unloaded by the first picker 53 and the second picker 63 thereby to increase a working efficiency.

Figure 9:
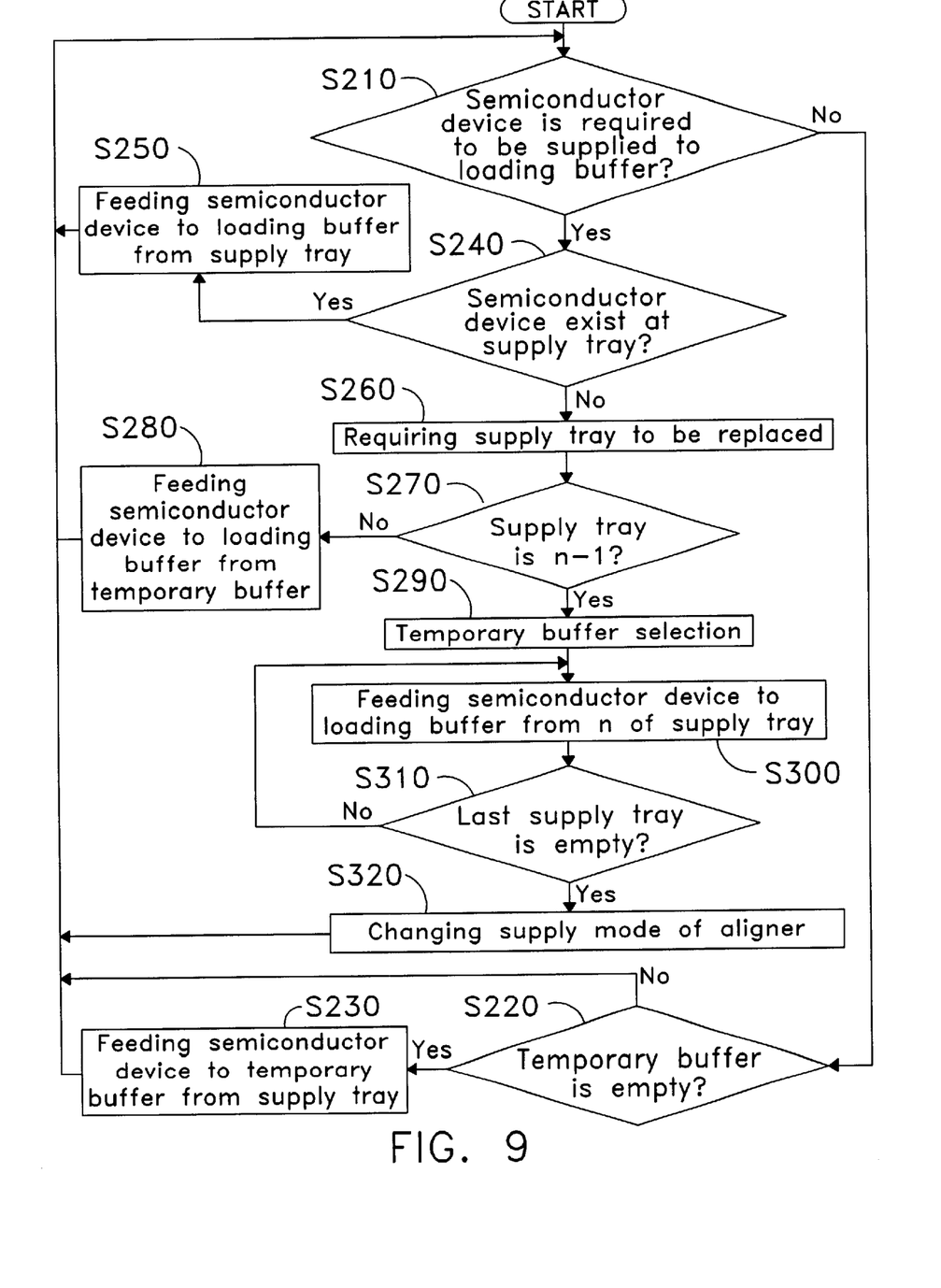
FIG. 9 is a flow chart showing a loading method of a semiconductor device using a temporary buffer according to another embodiment of the present invention.
Figure 10:
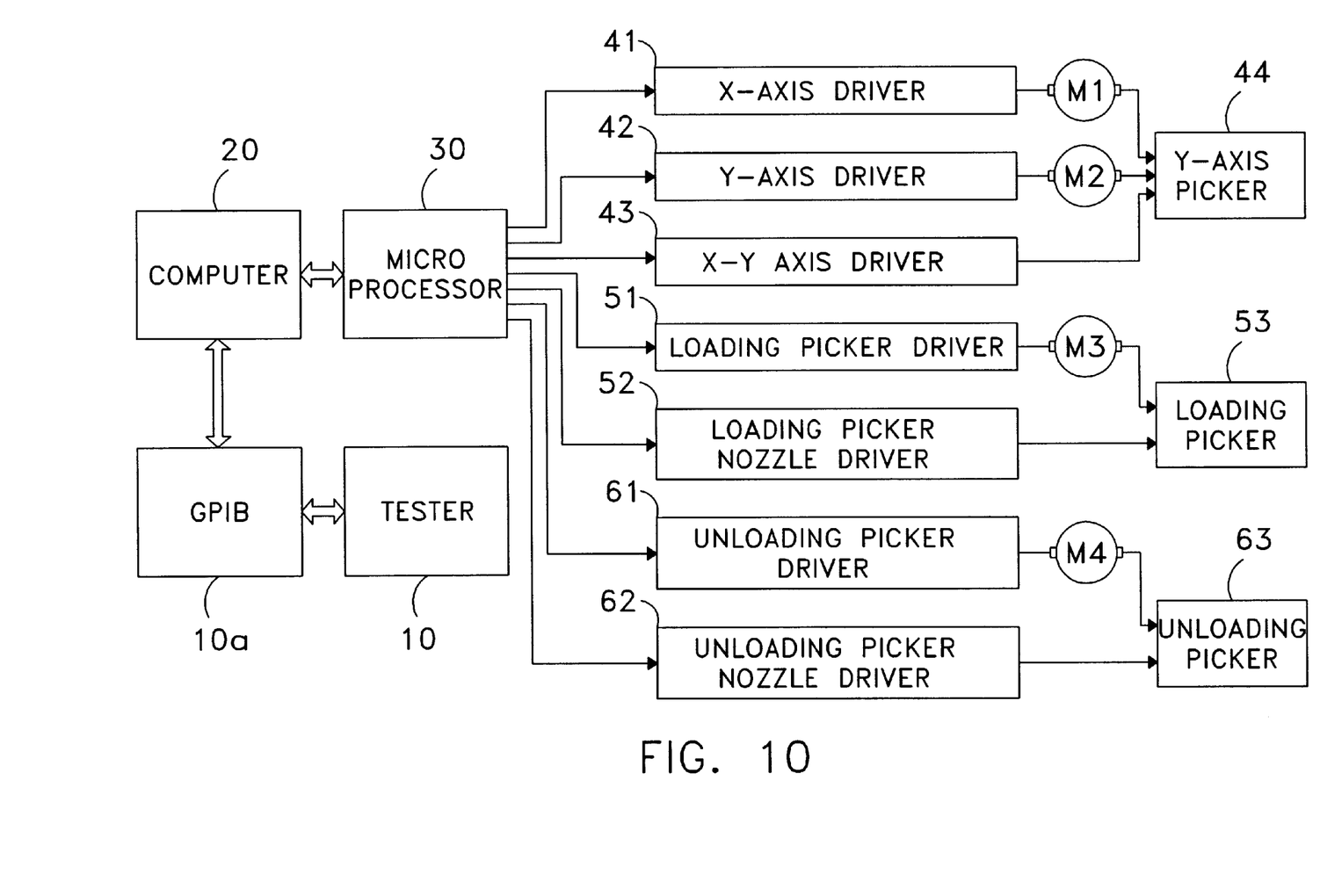
FIG. 10 is a block diagram of a loading device of a semiconductor device applies with FIG. 9.
Figure 11:
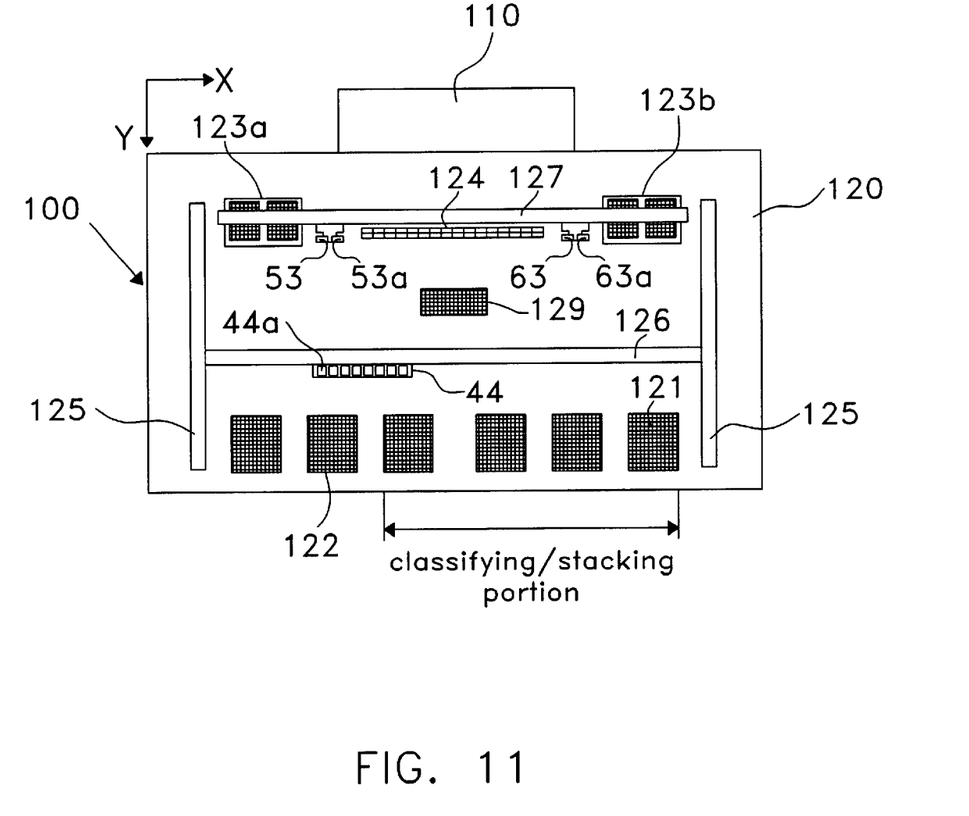
FIG. 11 is a plan view of a handler applied with FIG. 9.

FIGS. 9 to 11 show a third embodiment of the present invention. FIG. 9 is a flow chart showing a loading method of a semiconductor device using a temporary buffer according to another embodiment of the present invention, FIG. 10 is a block diagram of a loading device of a semiconductor device applies with FIG. 9, and FIG. 11 is a plan view of a handler applied with FIG. 9.

As shown in FIGS. 9 to 11, a loading/unloading control method of semiconductor devices includes the step S210 of determining whether the semiconductor device is required to be supplied to the loading buffer 123a; the step S220 of determining whether a temporary buffer 129 is empty by a microprocessor 30 when the semiconductor device is not required to be supplied to the loading buffer 123a ; the step S230 of transferring the semiconductor device served at a supply tray 122 to the temporary buffer 129 by the X-Y axis picker 44 when the temporary buffer 129 is empty; the step S240 of determining whether semiconductor devices exist at the supply tray 122 by the microprocessor 30 when the semiconductor device is required to be supplied to the loading buffer 123a; the step S260 of requiring the replacing of the supply tray 122 by the microprocessor 30 when the supply tray 122 does not have semiconductor devices; the step S270 of determining whether the replaced supply-tray is n−1 when the supply tray 122 has been replaced; and the step S280 of transferring the semiconductor devices served at the temporary buffer 129 to the loading buffer 123a by the X-Y axis picker 44 when the replaced supply tray 122 is not n−1.

The test device 10 tests the semiconductor device and outputs the result of test to the computer 20 through the GPIB 10a thereby to be transmitted to the microprocessor 30.

Accordingly, the microprocessor 30 classifies and stacks the tested semiconductor devices according to the data from the computer 20.

The tested semiconductor devices are transferred to the aligner 124 from the chamber 110 thereby to be unloaded to the buffer 123b. At this time, the unloading picker 63 is used for unloading the semiconductor device to the unloading buffer 123b from the aligner 124 and controlled by the unloading picker driver 61 and the fourth motor M4 being controlled by the microprocessor 30 to move in the X axis direction thereby to be unloaded the semiconductor device.

The semiconductor devices located at the aligner 124 are sucked by the nozzle 63a being driven by the unloading picker nozzle driver 62 thereby to be transferred to the unloading buffer 123b. Next, the semiconductor devices are classified and stacked to the sorting tray 121 after they are classified by the X-Y axis picker 44.

The semiconductor devices are tested by the test device 10. For loading the semiconductor devices to the test device 10 the semiconductor devices are firstly mounted to the supply tray 122. The supply tray 122 is mounted with some semiconductor devices and is stacked by plurality of numbers of that by the handler 100. In the present invention, the supply tray 122 of n numbers are established to be stacked by the handler 100.

The supply tray 122 stacked at the handler 100 is, in regular sequence, moved to the working table thereby to load the semiconductor devices to be tested to the chamber 110. After the supply tray 122 is moved on the working table, the microprocessor 30 drives the X-axis picker driver 41 and the Y-axis picker driver 42, the first motor M1 and the second motor M2 thereby to move the X-Y axis picker 44 in the X-axis or Y-axis direction. Accordingly, the semiconductor devices placed at the supply tray 122 are transferred to the loading buffer 123a.

The X-Y axis picker 44 moves in the X-axis or Y-axis direction of the working table under the state of being guided by the guide axes 125 and 126 and sucks semiconductor devices by its nozzle 44a, thereby to feed to the loading buffer 123a. The nozzle 44a is driven by the X-Y axis picker nozzle driver 43 being controlled by the microprocessor and is controlled to suck or release the semiconductor devices at the time of being completed the movement of the X-Y axis picker 44.

The semiconductor devices transferred to the loading buffer 123a by the X-Y axis picker 44 are transferred to the aligner 124 by the loading picker to be mounted thereon. The loading picker 53 is guided by the guide axis 127 to be moved. The semiconductor devices mounted at the loading buffer 123a are sucked by the nozzle 53a being controlled by the loading picker nozzle driver 52 and is mounted at the aligner 124.

As the foregoing description, for transferring the semiconductor devices served at the supply tray 122 to the loading buffer 123a and the aligner 124, the X-Y axis picker 44 and the loading picker 53 are used. When the handler 100 is initialized, the loading picker 53 and the X-Y axis picker 44 are returned to their original positions. Under this state, the microprocessor 30 determines whether semiconductor devices to be tested are required to be supplied to the loading buffer 123a (S210).

The microprocessor 30 previously stores the control program for controlling the handler 100 at its ROM. Accordingly, the microprocessor 30 determines whether the semiconductor devices are required to be supplied, and the number of semiconductor device and the number of supply tray 122 using the control program.

When the microprocessor 30 determines that semiconductor devices are not required to be supplied to the loading buffer 123a, a determination whether the temporary buffer 129 is empty is performed (S220).

As a result of determination, when the temporary buffer 129 is determined to be empty, the microprocessor 30 drives the X-Y axis picker 44 thereby to feed the semiconductor devices served at the supply tray 122 to the temporary buffer 129. On the contrary, when semiconductor devices are required to be supplied to the loading buffer 123a, the microprocessor 30 determines whether the supply tray 122 has served with the semiconductor device (S240).

As a result of that, when the supply tray 122 is served with the semiconductor devices, the semiconductor devices are transferred to the loading buffer 123a by the X-Y axis picker 44. On the other hand, when the supply tray 122 is not served with the semiconductor devices, the microprocessor 30 requires the supply tray 122 to be replaced (S260). After the supply tray 122 is replaced, the microprocessor 30 determines whether the replaced supply tray 122 is n−1 (S270). When the replaced supply tray 122 is not n−1, the semiconductor devices served at the temporary buffer 129 are transferred to the loading buffer 123a by the X-Y axis picker 44 (S280).

While the supply tray 122 is replaced, the semiconductor devices are transferred to the loading buffer 123a and accordingly the X-Y axis picker 44 does not need to wait. That is, while the supply tray 122 is replaced, the loading working can be smoothly performed because the semiconductor devices are continuously supplied to the loading buffer 123a. Furthermore, the number of test can be decreased. That is, when the replaced supply tray 122 is n−1, the semiconductor devices served at the n−1 tray 122 is transferred to the temporary buffer 129 by the X-Y axis picker 44 (S290).

After all the semiconductor devices are filled at the temporary buffer 129, the semiconductor devices served at the n-1 supply tray 122 and the last n are transferred to the loading buffer 123a by the X-Y axis picker 44 (S300). All the semiconductor devices served at the supply tray 122 of n are loaded, the microprocessor 30 determines whether the supply tray 122 of n is empty or not.

As a result of determination when the n supply tray 122 is empty, the mode for supplying the semiconductor devices from the loading buffer 123a to the aligner 124 is changed (S320). For example, when 16 semiconductor devices are in series mounted at the aligner 124, the position for mounting the semiconductor device is skipped by one position thereby to be mounted all eight numbers.

Under the eight numbers of semiconductor devices being mounted at the aligner 124 thereby to be mounted to the test tray, the test for the semiconductor device can be accomplished only one time. That is, when the aligner 124 is mounted with 16 semiconductor devices, the test device 10 performs its testing operation two times. This is because a socket spacing of the test device 10 is large although the semiconductor devices mounted at the test tray are in close order. Therefore, by mounting eight semiconductor devices on the aligner 124 to the test tray, a test operation can be completed by only one test cycle when the last test is performed.

Having described specific preferred embodiments of the invention with reference to the accompanying drawings, it is to be understood that various changes and modifications may be effected therein by one skilled in the art without departing from the scope or spirit of the invention as defined in the appended claims.

As described above, the present invention can easily perform the unloading working of the semiconductor device because the semiconductor device served at the unloading buffer is transferred to the sorting buffer by the X-Y axis picker using the standby time of the X-Y axis picker being generated during the replacing of the sorting tray. Furthermore, because the first picker and the second picker operates to load and unload the semiconductor device, the loading/unloading time for the semiconductor device can be saved. Furthermore, because the first picker and the second picker are divided their moving region on the basis of the central line of the aligner, the moving distance can be decreased. Furthermore, the first picker and the second picker can prevent their collision by moving by a predetermined distance.

Further, because the semiconductor device served at the temporary buffer is transferred to the loading buffer while the supply tray is replaced, the loading working of the semiconductor device can be easily performed.

Further, because the mode for mounting the remaining semiconductor device to the aligner is changed at the time of completing the test, test working efficiency can be increased.

What is claimed is:

1. A method of unloading tested semiconductor devices from a test area of a testing machine, comprising:
   determining whether a tested semiconductor device is ready for unloading;
   determining, when a tested semiconductor device is ready for unloading, whether a first sorting tray corresponding to a capacity of the tested semiconductor device is ready to receive the tested semiconductor device;
   replacing the first sorting tray corresponding to the capacity of the tested semiconductor device with a second sorting tray when the first sorting tray is not ready to receive the tested semiconductor device; and
   transferring the tested semiconductor device to a sorting buffer until the first sorting tray has been replaced with the second sorting tray.

2. The method of claim 1, further comprising transferring the tested semiconductor device from the sorting buffer to the second sorting tray after the first sorting tray has been replaced with the second sorting tray.

3. The method of claim 1, further comprising transferring the tested semiconductor device to the first sorting tray when it is determined that the first sorting tray is ready to receive the tested semiconductor device.

4. The method of claim 1, further comprising transferring a tested semiconductor device to an unloading buffer using an unloading picker when a tested semiconductor device is ready for unloading, wherein the step of transferring the tested semiconductor to a sorting buffer comprises transferring the tested semiconductor device from the unloading buffer to the sorting buffer using an X-Y axis picker.

5. The method of claim 1, further comprising transferring tested semiconductor devices to first and second loading/unloading buffers with first and second loading/unloading pickers, respectively, when tested semiconductor devices are ready for unloading, and wherein the step of transferring the tested semiconductor device to the sorting buffer comprises transferring the tested semiconductor device from one of the first and second loading/unloading buffers to the sorting buffer using an X-Y axis picker.

6. A method of loading/unloading semiconductor devices into and out of a test area of a testing machine, comprising:
   determining whether semiconductor devices to be tested are waiting in a first supply tray;
   transferring the semiconductor devices to be tested to a loading/unloading buffer with an X-Y axis picker when semiconductor devices to be tested are waiting in the first supply tray;
   transferring semiconductor devices to be tested from the loading/unloading buffer to an aligner tray with a loading/unloading picker;
   determining whether tested semiconductor devices are ready for unloading;
   transferring tested semiconductor devices from an aligner tray to a loading/unloading buffer with a loading/unloading picker; and
   transferring tested semiconductor devices from the loading/unloading buffer to at least one sorting tray with the X-Y axis picker.

7. The method of claim 6, wherein the step of transferring semiconductor devices to be tested to a loading/unloading buffer comprises transferring the semiconductor devices to be tested to first and second loading/unloading buffers with the X-Y axis picker.

8. The method of claim 7, wherein the step of transferring semiconductor devices from the loading/unloading buffer to the aligner tray comprises transferring semiconductor devices from the first and second loading/unloading buffers to the aligner tray with first and second loading/unloading pickers, respectively.

9. The method of claim 8, wherein the step of transferring tested semiconductor devices from the aligner tray to a loading/unloading buffer comprises transferring the semiconductor devices from the aligner tray to the first and second loading/unloading buffers with the first and second loading/unloading pickers, respectively.

10. The method of claim 9, wherein the step of transferring semiconductor devices from the loading/unloading buffer to at least one sorting tray comprises transferring semiconductor devices from the first and second loading/unloading buffers to the at least one sorting tray with the X-Y axis picker.

11. The method of claim 6, wherein the step of transferring tested semiconductor devices from the aligner tray to a loading/unloading buffer comprises transferring the semiconductor devices from the aligner tray to first and second loading/unloading buffers with first and second loading/unloading pickers, respectively.

12. The method of claim 11, wherein the step of transferring semiconductor devices from the loading/unloading buffer to at least one sorting tray comprises transferring semiconductor devices from the first and second loading/unloading buffers to the at least one sorting tray with the X-Y axis picker.

13. A method of loading semiconductor devices into a testing machine, comprising:
   transferring semiconductor devices to be tested from a supply tray at a supply location to a loading buffer with an X-Y axis picker when the loading buffer is at least partially empty;
   transferring semiconductor devices to be tested from the supply tray to a temporary buffer with the X-Y axis picker when the loading buffer is full and the X-Y axis picker is available;
   determining whether the supply tray at the supply location is empty;
   replacing, when it is determined that the supply tray is empty, the empty supply tray with a new supply tray that contains semiconductor devices to be tested; and
   transferring semiconductor devices to be tested from the temporary buffer to the loading buffer while the supply tray is being replaced.

14. The method of claim 13, wherein the step of transferring semiconductor devices to be tested from the supply tray to the temporary buffer comprises:
   determining if the supply tray at the supply location is the next to last supply tray; and
   transferring the semiconductor devices to be tested from the supply tray at the supply location to the temporary buffer when it is determined that the supply tray is the next to last supply tray.

15. An apparatus for transferring semiconductor devices into and out of a testing apparatus, comprising:
   a first loading/unloading picker for transferring semiconductor devices between a first loading/unloading buffer and an aligner;
   a second loading/unloading picker for transferring semiconductor devices between a second loading/unloading buffer and the aligner; and
   a controller configured to control the first and second loading/unloading pickers so that the first and second loading/unloading pickers can simultaneously transfer semiconductor devices from the first and second loading/unloading buffers, respectively, to the aligner.

16. The apparatus of claim 15, wherein the controller is also configured to control the first and second loading/unloading pickers to simultaneously transfer semiconductor devices from the aligner to the first and second loading/unloading buffers, respectively.

17. An apparatus for sorting tested semiconductor devices into a plurality of sorting trays, comprising:
   an unloading picker configured to transfer tested semiconductor devices from a testing area to an unloading buffer;
   an X-Y axis picker configured to transfer tested semiconductor devices from the unloading buffer to one of a plurality of sorting trays located at a respective plurality of sorting locations, and to a sorting buffer; and
   a controller configured to control the X-Y axis picker, and to determine when a sorting tray at one of the plurality of sorting stations is full of tested semiconductor devices, wherein the controller is configured to cause the X-Y axis picker to transfer a tested semiconductor device to the sorting buffer when the sorting tray at a sorting location designated to receive the tested semiconductor device is determined to be full.

18. The apparatus of claim 17, wherein the controller is also configured to cause a sorting tray to be replaced when it is determined to be full of tested semiconductor devices.

19. The apparatus of claim 18, wherein the controller is configured to cause the X-Y axis picker to transfer tested semiconductor devices from the sorting buffer to the sorting trays at the plurality of sorting locations as space becomes available in the sorting trays.

20. An apparatus for loading semiconductor devices into a loading buffer of a testing apparatus, comprising:

an X-Y axis picker configured to transfer semiconductor devices to be tested between a set of supply trays at a supply location, a temporary buffer, and the loading buffer of a testing apparatus; and a controller configured to control the X-Y axis picker and to determine when the last or next to last supply tray of a set is at the supply location, wherein the controller is configured to cause the X-Y axis picker to transfer semiconductor devices from the supply tray to the loading buffer when it is determined that the supply tray at the supply location is not the last or next to last supply tray of a set, and wherein the controller is configured to cause the X-Y axis picker to transfer semiconductor devices from the supply tray at the supply location to the temporary buffer when it is determined that the supply tray at the supply location is the last or next to last supply tray of a set.

21. The apparatus of claim 20, wherein the controller is also configured to cause a set of supply trays to be replaced when the semiconductor devices have all been removed from the last supply tray of the set, and wherein the controller causes the X-Y axis picker to transfer semiconductor devices from the temporary buffer to the loading buffer while the set of supply trays is replaced.

* * * * *